(12) United States Patent
Watanabe

(10) Patent No.: US 6,896,997 B2
(45) Date of Patent: *May 24, 2005

(54) METHOD FOR FORMING RESIST PATTERN

(75) Inventor: Minoru Watanabe, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 91 days.

This patent is subject to a terminal disclaimer.

(21) Appl. No.: 10/334,833

(22) Filed: Jan. 2, 2003

(65) Prior Publication Data

US 2003/0129544 A1 Jul. 10, 2003

Related U.S. Application Data

(60) Continuation-in-part of application No. 10/025,783, filed on Dec. 26, 2001, now Pat. No. 6,806,005, which is a continuation of application No. 09/930,290, filed on Aug. 16, 2001, now Pat. No. 6,692,164, which is a division of application No. 09/443,500, filed on Nov. 19, 1999, now Pat. No. 6,372,389.

(51) Int. Cl.$^7$ ................................................. G03F 7/26
(52) U.S. Cl. ........................ 430/3; 430/311; 430/322; 430/330
(58) Field of Search ............................. 430/3, 311, 322, 430/330; 134/1, 1.3

(56) References Cited

U.S. PATENT DOCUMENTS

| | | | | |
|---|---|---|---|---|
| 4,547,455 A | * | 10/1985 | Hiramoto et al. | 430/325 |
| 6,372,389 B1 | * | 4/2002 | Watanabe | 430/3 |
| 2002/0055049 A1 | * | 5/2002 | Watanabe | 430/3 |

* cited by examiner

Primary Examiner—Kathleen Duda
(74) Attorney, Agent, or Firm—Rabin & Berdo, P.C.

(57) ABSTRACT

A method of forming a resist pattern on a semiconductor substrate, includes forming a resist film on the semiconductor substrate, and supplying a developing solution on the resist film to remove the resist film, wherein a portion of the resist film remains on the semiconductor substrate. The method also includes providing a rinsing liquid from a rinsing liquid supplying nozzle on the semiconductor substrate on which the patterned resist film is formed in such a way that the rinsing liquid remains on the semiconductor substrate by surface tension, ultrasonic vibration being applied to the rinsing liquid supplying nozzle, and removing the rinsing liquid remaining on the semiconductor substrate.

26 Claims, 5 Drawing Sheets

MASK SIZE:0.20 μmL&S

METHOD FOR FORMING RESIST PATTERN

CROSS REFERENCE TO RELATED APPLICATIONS

This application is a Continuation-in-Part (CIP) patent application of its parent patent application Ser. No. 10/025,783, filed on Dec. 26, 2001 now U.S. Pat. No. 6,806,005, which, in turn, is a Continuation Application of its parent patent application Ser. No. 09/930,290, filed on Aug. 16, 2001 now U.S. Pat. No. 6,692,164, which, in turn, is a Divisional Application of its parent patent application Ser. No. 09/443,500, filed on Nov. 19, 1999, now U.S. Pat. No. 6,372,389.

BACKGROUND OF THE INVENTION

The present invention relates to a method and apparatus for forming a resist pattern on a substrate used in semiconductor fabrication processes and a resist pattern used for a photomask such as a reticle.

Recently, chemically amplified resist patterns are formed by means of the lithographic technique utilizing the KrF excimer laser exposure. Especially, negative resist, which provides unexposed portions that dissolve in developing solution, is important for super-resolution techniques (Levenson phase shift masks).

However, if chemically amplified negative resist is used to produce a line-and-space pattern 21, for instance, microbridges 22 that partially connect adjacent portions of the pattern are readily formed, as shown in FIG. 1, reducing yields.

SUMMARY OF THE INVENTION

An object of the present invention is to provide a method and apparatus for forming a resist pattern on a substrate, which suppresses generation of microbridges.

According to an aspect of the present invention, a method of forming a resist pattern on a semiconductor substrate, includes forming a resist film on the semiconductor substrate, and supplying a developing solution on the resist film to remove the resist film, wherein a portion of the resist film remains on the semiconductor substrate. The method also includes supplying a rinsing liquid from a rinsing liquid supplying nozzle on the semiconductor substrate on which the patterned resist film is formed in such a way that the rinsing liquid remains on the semiconductor substrate by surface tension, ultrasonic vibration being applied to the rinsing liquid supplying nozzle, and removing the rinsing liquid remaining on the semiconductor substrate.

BRIEF DESCRIPTION OF THE INVENTION

The present invention will become more fully understood from the detailed description given hereinbelow and the accompanying drawings which are given by way of illustration only, and thus are not limitative of the present invention, and wherein.

DETAILED DESCRIPTION OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

First Embodiment

FIGS. 2A to 2F are diagrams showing the steps of a process for forming a resist pattern according to a first embodiment of the present invention.

Figure 2A:
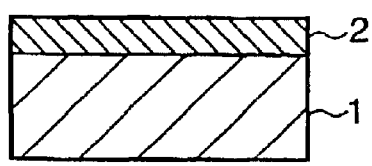
FIGS. 2A to 2F are diagrams showing the steps of a process for forming a resist pattern according to a first embodiment of the present invention.

In the first embodiment, a negative resist film 2 is first formed on a substrate 1 through spin coating or another method, as shown in FIG. 2A. The substrate 1 is a silicon substrate, for instance. The negative resist film 2 is made of chemically amplified negative resist, is about 0.5 $\mu$m thick, and is prebaked (PB) at about 110° C., for instance. However, the materials, thickness, and processing temperature of the substrate 1 and the negative resist film 2 are not limited to those described above. In addition, a positive resist film may be used instead of the negative resist film 2.

Figure 2B:
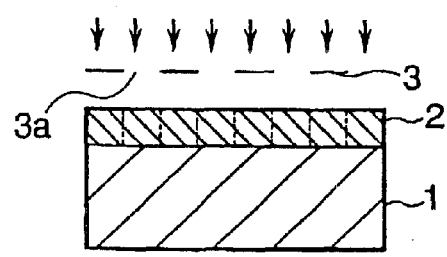

Next, as shown in FIG. 2B, the negative resist film 2 is exposed to light passing through the mask 3 having a desired pattern of openings 3a. The light exposure amounts to about 23 mJ/cm$^2$, for instance. The shape of the mask is not limited to the one shown in the figure, and the light exposure is not limited to the value indicated above.

Figure 2C:
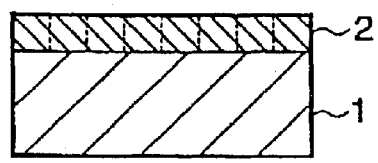

Then, as shown in FIG. 2C, the post exposure bake (PEB) processing is performed. The PEB processing is heat-up processing at about 105° C. The temperature of the PEB processing may be different from the value indicated above.

Figure 2D:

Next, as shown in FIG. 2D, developing solution is supplied to remove the unexposed portions of the negative resist film 2. The developing solution may be supplied by directing jets of developing solution through a nozzle or by submerging the substrate in the developing solution, for instance. The developing solution is, for example, a 2.38% tetramethylammonium hydroxide (TMAH) developing solution, which is an alkaline developing solution. The developing time is about 60 seconds, for instance. However, the developing solution and developing time are not limited to those indicated above.

Figure 2E:
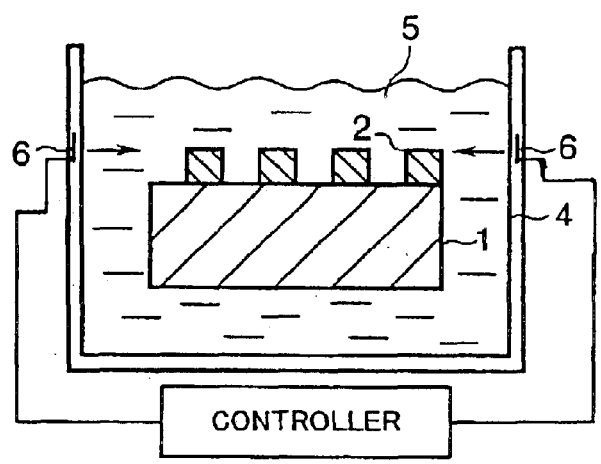

Then, as shown in FIG. 2E, the substrate land the developed negative resist film 2 are submerged in pure water 5, which is the rinsing liquid kept in a rinsing tank 4, then ultrasonic vibration is applied to the pure water 5. The frequency of ultrasonic vibration ranges from 40 kHz to 50 kHz, for instance. The ultrasonic generator 6 is built in the wall structure of the rinsing tank (container) 4 filled with the pure water 5. The ultrasonic generator 6, however, may be provided inside or outside the container 4 and may also be disposed on a table on which the container 4 is placed. The ultrasonic frequency and ultrasonic processing time can be changed as desired by means of a controller.

Figure 2F:
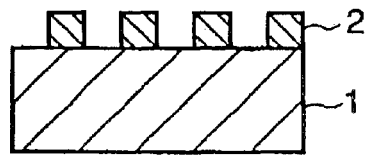

Then, as shown in FIG. 2F, the substrate 1 having the negative resist film 2 is taken out of the rinsing liquid and dried. In the drying step, the spin dry method is used, for instance.

Figure 1:
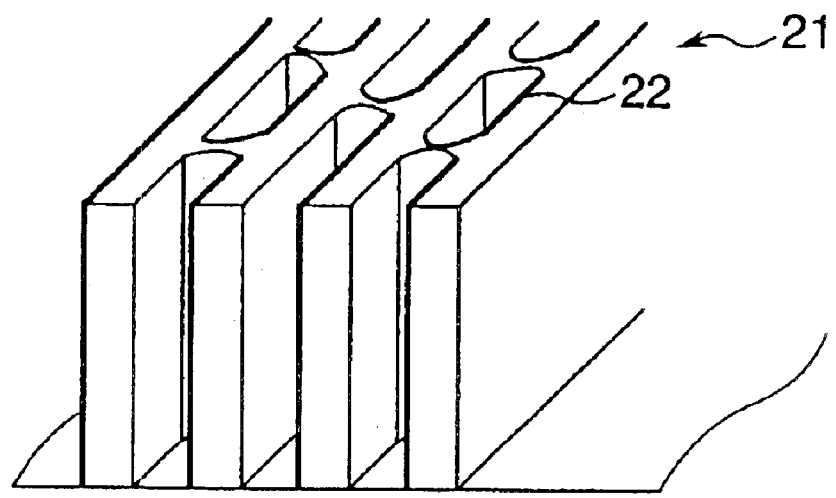
FIG. 1 is a perspective view showing microbridges that partially connect adjacent portions of the pattern.
Figure 3:
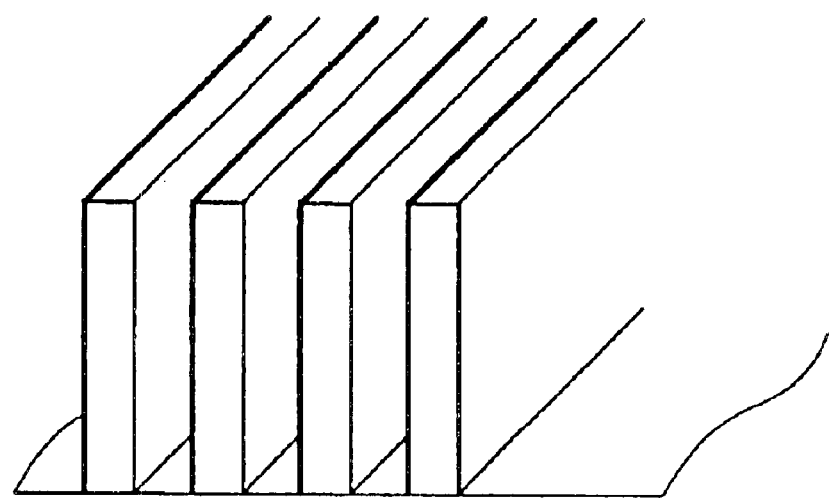
FIG. 3 is a perspective view showing a resist pattern free from microbridges.

As has been described above, the generation of microbridges can be suppressed through a quick and convenient method such as ultrasonic processing during rinsing, according to the first embodiment. As a result, a resist pattern free from microbridges can be formed, as shown in FIG. 3. Moreover, by combining the ultrasonic processing unit and the pure water processing unit into a single unit, the throughput can be improved.

Figure 4A:
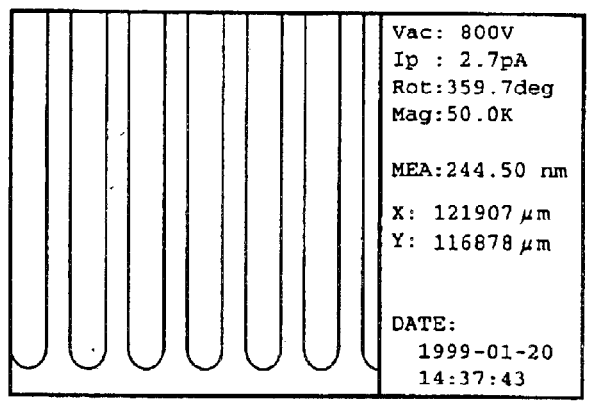
FIGS. 4A and 4B are diagrams showing schematic views of a pattern formed through the rinsing step in which ultrasonic vibration is applied (the first embodiment) and a pattern formed through the conventional method.
Figure 4B:
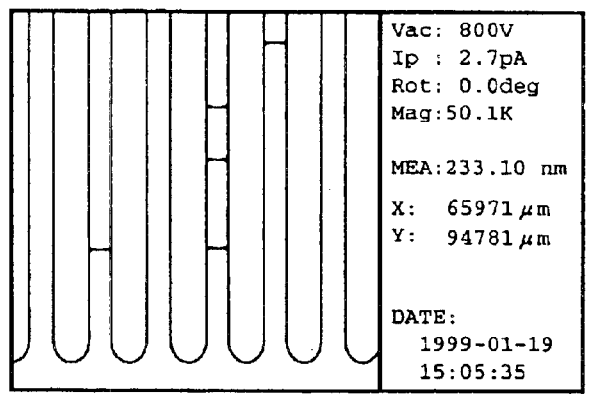

FIGS. 4A and 4B are diagrams showing schematic views of a pattern formed through the rinsing step in which ultrasonic vibration is applied (pattern formed according to the first embodiment) and a pattern formed through the rinsing step in which no ultrasonic vibration is applied (pattern formed by the conventional method). In the experiment for forming the pattern shown in FIG. 4A, the silicon substrate is applied with a layer of commercially available chemically amplified negative resist of about 0.5 $\mu$m thick, a resist film is formed through the PB processing at about 110° C. and exposed to light of about 23 mJ/cm$^2$, then the PEB processing is performed at about 105° C. In the developing step, a 2.38% TMAH developing solution is used as the alkaline developing solution, and a developing time of about 60 seconds is taken. In the rinsing step, the wafer is submerged in the pure water, and ultrasonic vibration of about 40 kHz to 50 kHz is applied. The compared example shown in FIG. 4B is formed by applying a layer of commercially available chemically amplified negative resist of about 0.5 $\mu$m thick on a silicon substrate, forming a resist film through the PB processing at about 110° C., exposing to light of about 23 mJ/cm$^2$, and performing the PEB processing at about 105° C. In the developing step, a 2.38% TMAH developing solution is used as the alkaline developing solution, and a developing time of about 60 seconds is taken. In the rinsing step, the wafer is submerged in the pure water, and no ultrasonic vibration is applied. This experiment proves that the generation of microbridges is suppressed by performing ultrasonic processing during rinsing.

Figure 5:
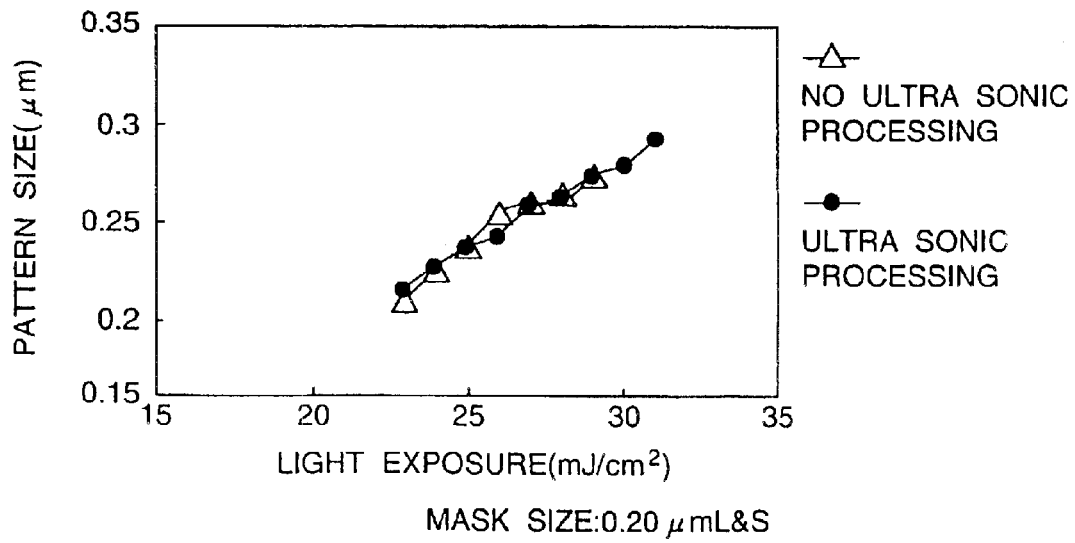
FIG. 5 shows the relationship between light exposure (mJ/cm$^2$) and pattern dimensions ($\mu$m) in the process for forming a resist pattern, depending on the ultrasonic processing.

FIG. 5 shows the relationship between light exposure (mJ/cm$^2$) and pattern dimensions ($\mu$m) in the process for forming a resist pattern, depending on the ultrasonic processing. In the figure, white triangles represent data taken when no ultrasonic processing is performed in rinsing (compared example shown in FIG. 4B) while black circles represent data taken when ultrasonic vibration is applied in rinsing (example shown in FIG. 4A according to the first embodiment). This experiment proves that the light exposure margin, which has a great effect on manufacturing yield, has also increased according to the first embodiment.

In the description above, the ultrasonic processing is performed in rinsing only, but the ultrasonic processing may be performed during the developing step.

Second Embodiment

FIGS. 6A to 6E are diagrams showing the steps of a process for forming a resist pattern according to a second embodiment of the present invention. With the second embodiment, a process for producing a photomask such as a reticle is described.

Figure 6A:
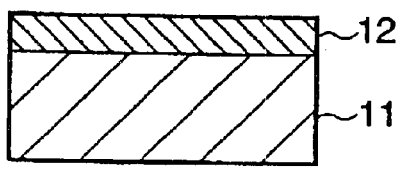
FIGS. 6A to 6E are diagrams showing the steps of a process for forming a resist pattern according to a second embodiment of the present invention.
Figure 6D:
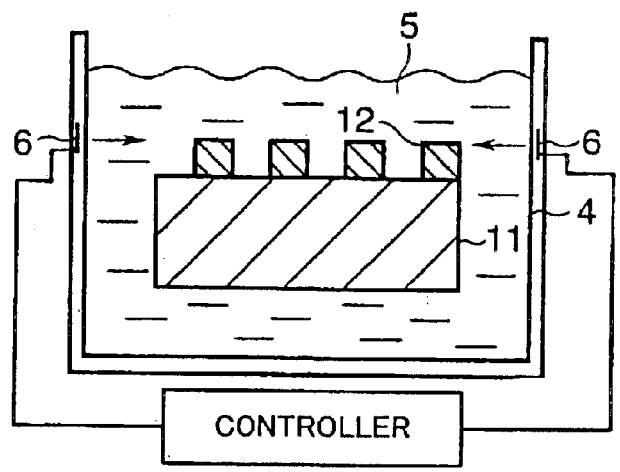
Figure 6B:
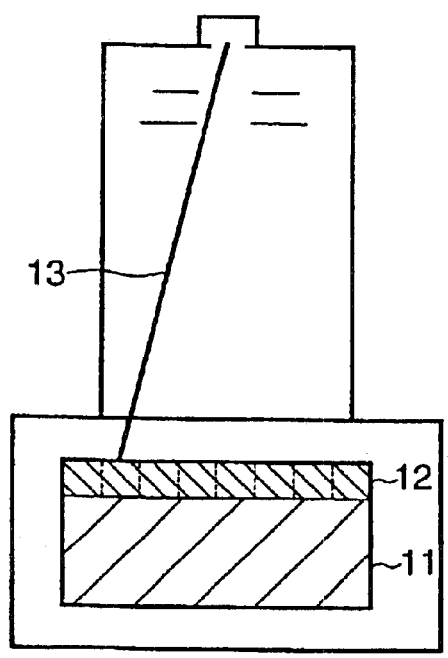
Figure 6E:
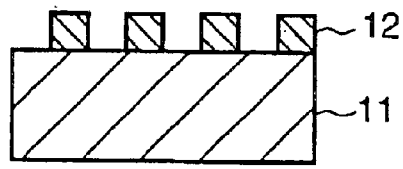
Figure 6C:
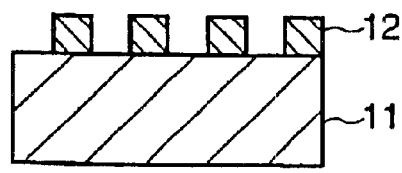

First, as shown in FIG. 6A, a negative resist film 12 is formed on a quartz substrate 11 through spin coating or another method, and then the PB processing is performed. Then, as shown in FIG. 6B, the electron beam (EB) lithography technique is used to irradiate the negative resist film 12 with a dose of electron beam 13, and the PEB processing is performed. Next, as shown in FIG. 6C, developing solution is supplied, and unexposed portions of the negative resist film 12 are removed. Then, as shown in FIG. 6D, the quartz substrate 11 and the developed negative resist film 12 are submerged in pure water 5, which is a rinsing liquid kept in the rinsing tank 4, and ultrasonic vibration is applied to the pure water. Next, as shown in FIG. 6E, the quartz substrate 11 having the negative resist film 12 is taken out of the rinsing liquid and dried.

As has been described above, the generation of microbridges can be suppressed by a quick and convenient method such as the ultrasonic processing during rinsing, according to the second embodiment. Consequently, a mask made from a resist pattern without microbridges can be formed, as shown in FIG. 3. The mask with few microbridges can be used for forming a 4-times reticle, for optical proximity correction (OPC), and for the like.

The second embodiment is the same as the first embodiment except for the items described above.

Third Embodiment

Figure 7:
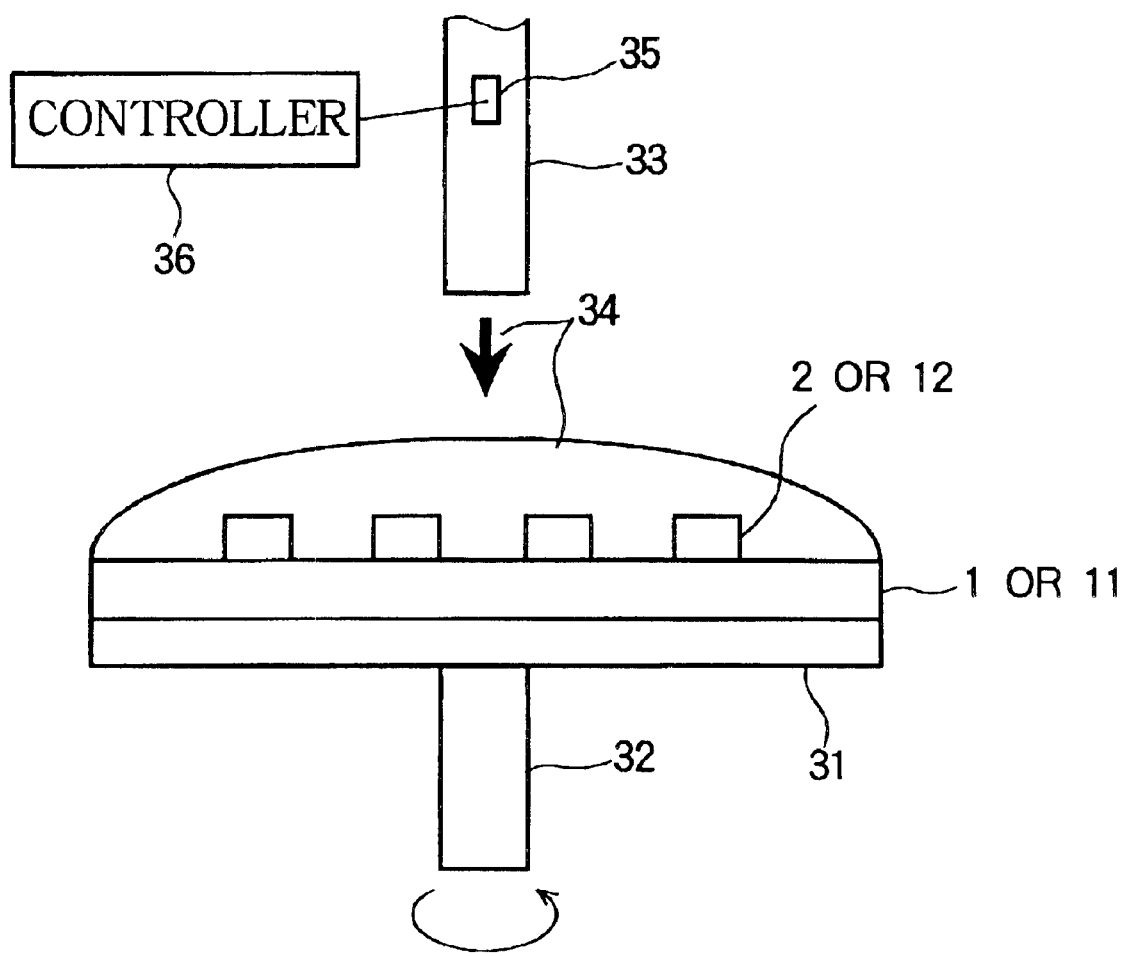
FIG. 7 is a diagram showing a rinsing process of a method of forming a resist pattern according to a third embodiment of the present invention.

FIG. 7 is a diagram showing a rinsing process of a method of forming a resist pattern according to a third embodiment of the present invention.

The method of the third embodiment includes a rinsing process that is different from that of the first or second embodiment. In the rinsing process of the third embodiment, the semiconductor substrate 1 (or 11), on which the patterned resist film 2 (or 12) is formed, is placed on a rotating table 31 that can rotates around a shaft 32. A rinsing liquid is supplied from a rinsing liquid supplying nozzle 33 on the semiconductor substrate 1 on which the patterned resist film 2 is formed in such a way that the rinsing liquid 34 remains on the semiconductor substrate 1 by surface tension, while ultrasonic vibration is being applied to the rinsing liquid supplying nozzle 33 by a ultrasonic generator 35. The ultrasonic generator 35 is controlled by a controller 36. After that, the rinsing liquid 34 remaining on the semiconductor substrate 1 is removed by rotating the rotating table 31.

When the resist pattern 2 on the semiconductor substrate 1 is formed from negative resist, there is a tendency to increase microbridges (i.e., the occurrence of poor resolution of the resist). The generation of such microbridges can be suppressed by a quick and convenient method such as the ultrasonic processing during rinsing, according to the third embodiment. Consequently, a mask made from a resist pattern without microbridges can be formed, as shown in FIG. 3.

The third embodiment is the same as the first or second embodiment except for the items described above.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A method of forming a resist pattern on a semiconductor substrate, comprising:

forming a resist film on the semiconductor substrate;

supplying a developing solution on the resist film to remove the resist film, wherein a portion of the resist film remains on the semiconductor substrate;

supplying a rinsing liquid from a rinsing liquid supplying nozzle on the semiconductor substrate on which the patterned resist film is formed in such away that the rinsing liquid remains on the semiconductor substrate by surface tension, ultrasonic vibration being applied to the rinsing liquid supplying nozzle; and removing the rinsing liquid remaining on the semiconductor substrate.

2. The method according to claim 1, wherein the ultrasonic vibration ranges from 40 kHz to 50 kHz.

3. The method according to claim 1, wherein the developing solution is an alkaline developing solution.

4. The method according to claim 3, wherein the alkaline developing solution includes tetramethylammonium hydroxide.

5. The method according to claim 1, further comprising:

exposing the resist film to light passing through a mask before supplying the developing solution.

6. The method according to claim 5, further comprising:

baking the resist film at a first temperature before exposing the resist film to the light; and baking the resist film at a second temperature after exposing the resist film to the light, wherein the second temperature is different from the first temperature.

7. The method according to claim 6, wherein the second temperature is lower than the first temperature.

8. The method according to claim 1, further comprising:

irradiating the resist film with an electron beam using an electron beam lithography technique before supplying the developing solution on the resist film.

9. The method according to claim 8, further comprising:

baking the resist film at a first temperature before irradiating the resist film with the electron beam; and baking the resist film at a second temperature after irradiating the resist film with the electron beam, wherein the second temperature is different from the first temperature.

10. The method according to claim 9, wherein the second temperature is lower than the first temperature.

11. The method according to claim 1, wherein the ultrasonic vibration is applied to the developing solution.

12. The method according to claim 1, wherein the rinsing liquid is pure water.

13. The method according to claim 1, wherein the removing step of the rinsing liquid is performed by rotating a table supporting the semiconductor substrate.

14. A method for fabricating a semiconductor device, comprising:

preparing a semiconductor substrate;

forming a resist film on the semiconductor substrate;

supplying a developing solution on the resist film for patterning the resist film, whereby a patterned resist film is formed on the semiconductor substrate;

supplying a rinsing liquid from a rinsing liquid supplying nozzle on the semiconductor substrate on which the patterned resist film is formed in such a way that the rinsing liquid remains on the semiconductor substrate by surface tension, ultrasonic vibration being applied to the rinsing liquid supplying nozzle; and removing the rinsing liquid remaining on the semiconductor substrate.

15. The method according to claim 14, wherein the ultrasonic vibration ranges from 40 kHz to 50 kHz.

16. The method according to claim 14, wherein the developing solution is an alkaline developing solution.

17. The method according to claim 16, wherein the alkaline developing solution includes tetramethylammonium hydroxide.

18. The method according to claim 14, further comprising:

exposing the resist film to light passing through a mask before supplying the developing solution.

19. The method according to claim 18, further comprising:

baking the resist film at a first temperature before exposing the resist film to the light; and baking the resist film at a second temperature after exposing the resist film to the light, wherein the second temperature is different from the first temperature.

20. The method according to claim 19, wherein the second temperature is lower than the first temperature.

21. The method according to claim 14, further comprising:

irradiating the resist film with an electron beam using an electron beam lithography technique before supplying the developing solution on the resist film.

22. The method according to claim 21, further comprising:

baking the resist film at a first temperature before irradiating the resist film with the electron beam; and baking the resist film at a second temperature after irradiating the resist film with the electron beam, wherein the second temperature is different from the first temperature.

23. The method according to claim 22, wherein the second temperature is lower than the first temperature.

24. The method according to claim 14, wherein the ultrasonic vibration is applied to the developing solution.

25. The method according to claim 14, wherein the rinsing liquid is pure water.

26. The method according to claim 14, wherein the removing step of the rinsing liquid is performed by rotating a table supporting the semiconductor substrate.

* * * * *